United States Patent
Tung et al.

(10) Patent No.: US 9,957,607 B2
(45) Date of Patent: May 1, 2018

(54) EVAPORATION METHOD

(71) Applicant: Industrial Technology Research Institute, Hsin-Chu (TW)

(72) Inventors: Fu-Ching Tung, Hsinchu (TW); Ching-Chiun Wang, Miaoli County (TW); Shih-Hsiang Lai, New Taipei (TW)

(73) Assignee: INDUSTRIAL TECHNOLOGY RESEARCH INSTITUTE, Hsin-Chu (TW)

( * ) Notice: Subject to any disclaimer, the term of this patent is extended or adjusted under 35 U.S.C. 154(b) by 0 days. days.

(21) Appl. No.: 15/432,426

(22) Filed: Feb. 14, 2017

(65) Prior Publication Data

US 2017/0159171 A1 Jun. 8, 2017

Related U.S. Application Data

(62) Division of application No. 14/851,472, filed on Sep. 11, 2015, now abandoned.

(30) Foreign Application Priority Data

Oct. 31, 2014 (TW) .............................. 103137848 A

(51) Int. Cl.
*C23C 16/54* (2006.01)
*C23C 14/54* (2006.01)
(Continued)

(52) U.S. Cl.
CPC ............ *C23C 14/542* (2013.01); *C23C 14/24* (2013.01); *C23C 14/28* (2013.01)

(58) Field of Classification Search
None
See application file for complete search history.

(56) References Cited

U.S. PATENT DOCUMENTS 4,224,897 A 9/1980 Dugdale
4,587,134 A * 5/1986 Shimozato .............. C23C 14/24
118/665
(Continued)

FOREIGN PATENT DOCUMENTS

CN 102534510 A 7/2012
TW I266808 11/2006
(Continued)

OTHER PUBLICATIONS

Jung Su Kim et al., "An application of ESD technology for the R2R printing process," Journal of Mechanical Science and Technology, Jan. 2010, vol. 24, Issue 1, pp. 301-305, Korean Society of Mechanical Engineers.
(Continued)

*Primary Examiner* — Joseph A Miller, Jr.
(74) *Attorney, Agent, or Firm* — WPAT, PC

(57) ABSTRACT

An evaporation method in this disclosure is adapted for performing an evaporation process upon a surface of an evaporation target substrate. In an embodiment, an evaporation source plate is arranged to be heated by a heater so as to evaporate an evaporation material to its gaseous state, and then enable the gaseous evaporation material to travel passing through holes of a shutter device and thus spread toward the surface of the evaporation target substrate for depositing a film. Moreover, the evaporation method uses a transmission device for controlling the opening/closing of the holes, and there is a heating area formed at a position between the shutter device and the evaporation source plate for allowing the evaporation source plate, the plural holes, the heating area, the evaporation material and the heater to be arranged parallel to one another from the top to bottom.

7 Claims, 4 Drawing Sheets

(51) Int. Cl.
*C23C 14/28* (2006.01)
*C23C 14/24* (2006.01)

(56) References Cited

U.S. PATENT DOCUMENTS

| | | | |
|---|---|---|---|
| 5,328,583 A * | 7/1994 | Kameyama | C23C 14/352 204/192.12 |
| 8,021,905 B1 | 9/2011 | Nath et al. | |
| 8,119,204 B2 | 2/2012 | Ikeda et al. | |
| 8,177,912 B2 | 5/2012 | Oda et al. | |
| 2004/0022942 A1 * | 2/2004 | Schade van Westrum | C23C 14/24 427/248.1 |
| 2006/0118047 A1 | 6/2006 | Papadimitrakopoulos et al. | |
| 2007/0089676 A1 * | 4/2007 | Klemm | C23C 14/042 118/726 |
| 2008/0260938 A1 | 10/2008 | Ikeda et al. | |
| 2009/0269937 A1 * | 10/2009 | Aburatani | C23C 16/4401 438/758 |
| 2011/0195186 A1 | 8/2011 | Chen et al. | |
| 2012/0141677 A1 * | 6/2012 | Honda | C23C 14/24 427/255.28 |
| 2012/0164776 A1 | 6/2012 | Rathweg et al. | |

FOREIGN PATENT DOCUMENTS

| | | |
|---|---|---|
| TW | I281948 | 6/2007 |
| TW | I306903 | 3/2009 |
| TW | 201202464 | 1/2012 |
| TW | M455016 | 6/2013 |
| TW | 201339339 | 10/2013 |
| TW | M466924 | 12/2013 |
| TW | I425107 | 2/2014 |
| TW | I447246 | 8/2014 |

OTHER PUBLICATIONS

Stergios Logothetidis, "Flexible organic electronic devices: Materials, process and applications," Materials Science and Engineering: B, vol. 152, Issues 1-3, Aug. 25, 2008, pp. 96-104, ISSN 0921-5107.

Sangyub Le et al., "Amorphous indium tin oxide electrodes for piezoelectric and light-emitting device deposited by vacuum roll to roll process," Thin Solid Films, vol. 517, Issue 14, May 29, 2009, pp. 4015-4018, ISSN 0040-6090.

Chun-Yu Chen et al., "Continuous blade coating for multi-layer large-area organic light-emitting diode and solar cell," Journal of Applied Physics, 110, 094501 (2011), http://dx.doi.org/10.1063/1.3636398, AIP Publishing.

Makoto Noda et al., "An OTFT-driven rollable OLED display," Journal of the Society for Information Display, vol. 19, Issue 4, pp. 316-322, Apr. 2011.

Chuo, Yindar et al., "Towards Self-Powering Touch/Flex-Sensitive OLED Systems," in Sensors Journal, IEEE, vol. 11, No. 11, pp. 2771-2779, Nov. 2011, doi: 10.1109/JSEN.2011.2160337.

* cited by examiner

EVAPORATION METHOD

CROSS REFERENCE TO RELATED APPLICATION

This application is a divisional application of co-pending U.S. application Ser. No. 14/851,472, filed on Sep. 11, 2015, which claims priority to Taiwan Patent Application No. 103137848 filed in the Taiwan Patent Office on Oct. 31, 2014, the entire content of which is incorporated herein by reference.

TECHNICAL FIELD

The present disclosure relates to an evaporation method, and more particularly to an evaporation technique for large-area thin film deposition capable of achieving precise film quality control with improved high deposition rate and material utilization ratio.

BACKGROUND

In a conventional film deposition technique for OLED devices, it is common to use point evaporation sources. Nevertheless, the adopting of such point evaporation source can only be suitably applied in an evaporation process for forming thin films onto a small-size substrate, such as a piece of 370 mm×470 mm substrate, with a low material utilization rate ranged between 5% to 6%, and a low deposition rate of about 0.3 to 0.8 nm/s in a comparatively longer tact time, i.e. as long as 40 min to 50 min. Although there are already linear evaporation sources being adopted and used in some advanced evaporation processes, the shortcoming of low material utilization rate that is commonly seen in the process using point evaporation source still exists, despite that it had been improved from 5% in point evaporation sources to 20%~50% in linear evaporation sources. In addition, in the early stage of a conventional evaporation process, not matter it is using a point evaporation source or a linear evaporation source, the evaporation source must be shielded and covered by a shutter. Since in the early stage the powder-like or granular-like evaporation material is just started being heated and thus the evaporation process is in a transient period when the consequent vapor flow rate is increasing gradually, the vapor flow that is increasing can cause unstable film deposition rate which will eventually cause film to be formed non-uniformly on the substrate. Therefore, at early stage of an evaporation process, the evaporation source should be shielded and covered until an equilibrium vapor saturation has been reached and thereby the resulting deposition rate is stabled, that is when the shutter can be opened for enabling an evaporation process.

For an evaporation technique of large-area thin film deposition, no matter it is using a point evaporation source or a linear evaporation source, the cosine law of distribution angle must be considered as the larger the substrate to be deposited is, the larger the distance between the evaporation source and the substrate should be. In addition, the size of the shutter is increased to cope with the larger substrate. For instance, for performing an evaporation process on a substrate that is longer than 1 meter, the distance between the used evaporation source and the substrate must be over 1 meter. Consequently, the film can still be deposited on the substrate non-uniformly as it can take too long for the one-meter-long substrate to travel passing the deposition chamber during the shutter is being activated to open and close in a reciprocation manner.

SUMMARY

The present disclosure provides an evaporation method for performing an evaporation process upon a surface of an evaporation target substrate. Operationally, first an evaporation material and an evaporation source plate are provided, while allowing the evaporation material to be coated on a surface of the evaporation source plate, and then the evaporation source plate is heated by a heater for transforming the evaporation material from its solid state to its gaseous state. Thereafter, a shutter device with a plurality of holes is provided for enabling the gaseous evaporation material to travel passing the holes and thus reaching the surface of the evaporation target substrate for film deposition, whereas the shutter device is coupled to a transmission device which is used for controlling the opening/closing of the holes of the shutter device. In addition, there is a heating area to be formed at a position between the shutter device and the evaporation source plate in a manner that the evaporation source plate, the plural holes, the heating area, the evaporation material and the heater are arranged parallel to one another from the top to bottom.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DETAILED DESCRIPTION

Figure 1:
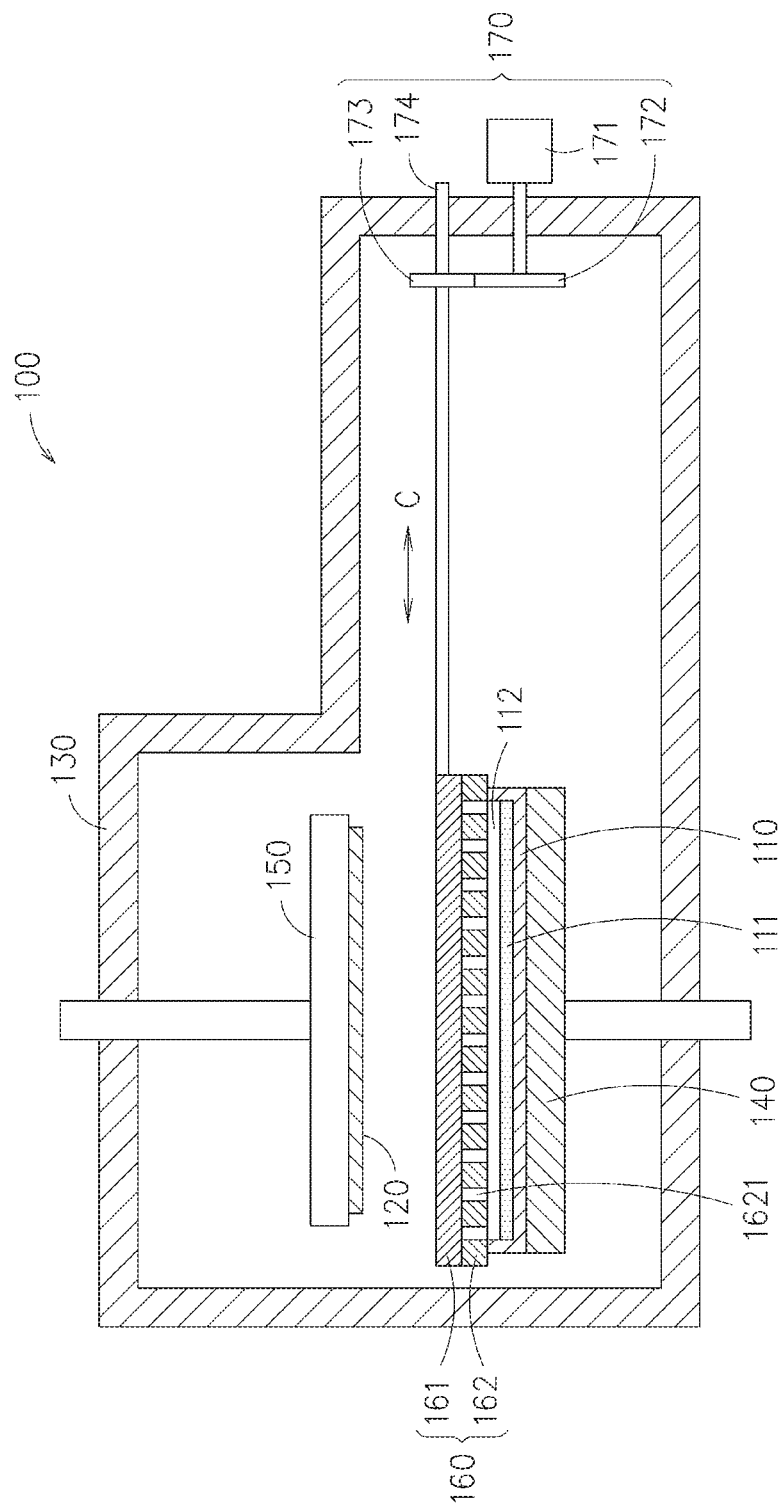
FIG. 1 is a schematic diagram showing an evaporation system according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Please refer to FIG. 1, which is a schematic diagram showing an evaporation system according to a first embodiment of the present disclosure. In the evaporation system 100 shown in FIG. 1, there is an evaporation source plate 110 being used for performing an evaporation process upon an target substrate 120, whereas the evaporation source plate 110 is substantially a source plate having at least one surface that is covered with an evaporation material 111 in a manner selected from the group consisting of: coating, inkjet printing and evaporation and the like, but is not limited thereby. There can be a variety of evaporation source plates 110 that are provided for various evaporation materials 111 to dispose thereon. For instance, it is noted that the surface of the evaporation source plate 110 provided for the evaporation material 111 to dispose thereon can be a surface selected from a planar surface, a smooth surface, a rough surface, and a pitted surface and correspondingly, the evaporation material 111 can be formed as a film with a planar surface, a smooth surface, a rough surface, or a pitted surface, or can be disposed on the surface of the source plate 110 into an array pattern composed of points, lines or planes of the evaporation material 111 by a means selected from the group consisting of: coating, inkjet printing and evaporation. The evaporation source plate 110 is made of a material with a specific heat resistance. That is, since the evaporation source plate 110 is provided for an evaporation process, the melting point of the evaporation source plate should at least be higher than the working temperature of the evaporation material 111 in the evaporation process. Moreover, the evaporation material 111 can be a pure substance or a composition of various substances, such as an evaporation material for forming copper indium gallium selenide (CIGS) films or an organic light-emitting layer for emitting red, green or blue light. Moreover, the evaporation material 111 is coated on a surface of the evaporation source plate 110 for forming a layer of evaporation material thereon, and for allowing the evaporation material 111 after being evaporated into a gaseous state to be distributed onto the target substrate 120 for film deposition.

As the evaporation system 100 shown in FIG. 1, an evaporation process is performed inside a vacuum evaporation chamber 130, while an evaporation source plate 110 which can be a two-dimensional planar structured crucible for housing an evaporation material 111 is placed at the lower portion of the vacuum chamber 130. It is noted that the surface of the evaporation source plate 110 provided for the evaporation material 111 to dispose thereon can be a smooth surface, a rough surface, a surface with grooved, or a surface with array of blind holes or blind slots. In addition, there is a heater 140 being disposed at a position under the evaporation source plate 110 for allowing the same to heat the evaporation material 111 disposed on the evaporation source plate 110, and thus transforming the solid-state evaporation material 111 into its gaseous state. Moreover, there can be a cooling device 150 being attached to the back of the target substrate 120 for cooling the same.

There is a shutter device 160 being disposed at a position between the evaporation source plate 110 and the evaporation target substrate 120, and thereby, there is an enclosed heating area 112 being formed by the shutter device 160 and the evaporation source plate 110. In this embodiment, the shutter device 160 further comprises a shutter plate 161 and a diffuser plate 162 in a manner that shutter plate 161 is coupled to a transmission device 170. In addition, the shutter plate 161 is disposed close to a side of the target substrate 120 while the diffuser plate 162 is disposed on top of the evaporation source plate 110. Before heating, the shutter device 160 is closed that the shutter plate 161 is arranged at a position for allowing the diffuser plate 162 to be shielded thereby, and thus enabling a confined enclosed space, i.e. the enclosed heating area 112, to be formed between the evaporation source plate 110 and the shutter device 160. The heater 140 is then being activated for heating the evaporation source plate 110, whereas the heater 140 can be an infrared (IR) heater, a radio frequency (RF) heater, a microwave (MW) heater or a high-power heater. In an embodiment, for example, the heater 140 is being activated to perform a heating procedure at a rapid rate, likely 100° C./sec, for allowing the evaporation material 111 to reach its evaporating temperature quickly, likely within 5 seconds. As soon as the evaporation material 111 is heated by the heater 140 to its evaporating temperature, the evaporation material 111 is transformed from its solid state into its gaseous state for starting to fill the enclosed heating area 112 with the vaporized evaporation material 111. At a time when the pressure difference between the enclosed heating area 112 and the vacuum chamber 130 is over 1 to 2 orders of magnitude, the transmission device 170 is activated for enabling the shutter plate 161 to open in a flash so as to expose the holes 1621 formed on the diffuser plate 162 for the gaseous evaporation material 111 to flow passing through and reach the surface of the target substrate 120. By the flash evaporation effect happened when the high-pressure vapor flow of the gaseous evaporation material 111 flows into the vacuum chamber 130 of lower pressure and also by the sizes, shapes and distribution of the holes 1621 on the diffuser plate 162 well designed, an uniform distributed vapor laminar flow can be achieved so as to form a uniform film deposition on the target substrate 120.

The transmission device 170 can be a manual transmission device, a ball screw transmission device, or a cam driving device. Nevertheless, different transmission devices will correspondingly have different configurations of power sources and driving mechanisms. In the embodiment shown in FIG. 1, a motor 170 is disposed outside the evaporation chamber 130 while allowing the driving force of the motor 171 to be fed to a ball nut 173 by a gear set or a pulley set 172. As the ball nut 173 is further coupled to a ball screw rod 174 while the ball nut 173 itself is fixed inside the evaporation chamber 130, the rotating ball nut 173 will bring along the ball screw rod 174 to move left or right, and thus enabling an upper panel 161 that is fixedly attached to the ball screw rod 174 to be moved by a displacement C.

Figure 2:
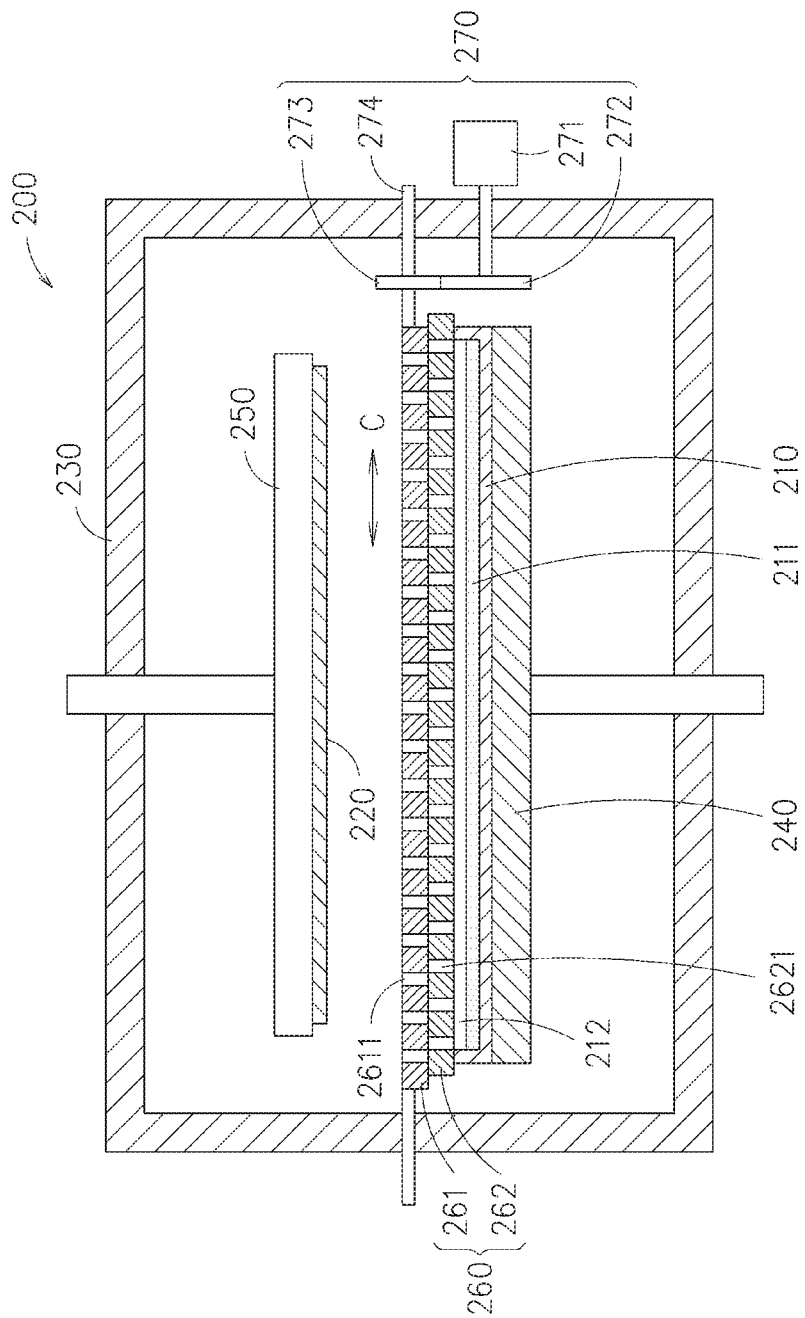
FIG. 2 is a schematic diagram showing an evaporation system according to another embodiment of the present disclosure whereas its shutter device is closed.

In an evaporation system 200 shown in FIG. 2, there is an evaporation source plate 210 that is provided for evaporation material 211 to be disposed thereon is placed inside an evaporation chamber 230, whereas the evaporation source plate 210 is disposed on top of a heater 240 while allowing the evaporation source plate 210 to be confined by a shutter device 260 that is arranged above the evaporation source plate 210. Moreover, there is a cooling device 250 being disposed at the back of the target substrate 220 for cooling the same. In this embodiment, the shutter device 260 is a composition of an upper panel 261 and a lower panel 262, while both of the two panels 261, 262 are formed respectively with a plurality of holes. Moreover, the upper panel 261 is disposed close to a side of the target substrate 220 while the lower panel 262 is disposed on top of the evaporation source plate 210. As shown in FIG. 2, the shutter device 260 is closed before heating, while the holes 2611 on the upper panel 261 are not aligned with holes 2621 on the lower panel 262, so that an enclosed space 212 is formed on top of the evaporation source plate 210. In addition, there is at least one panel that is selected from the upper panel 261 and the lower panel 262 is arranged coupling to a transmission device 270.

Figure 3:
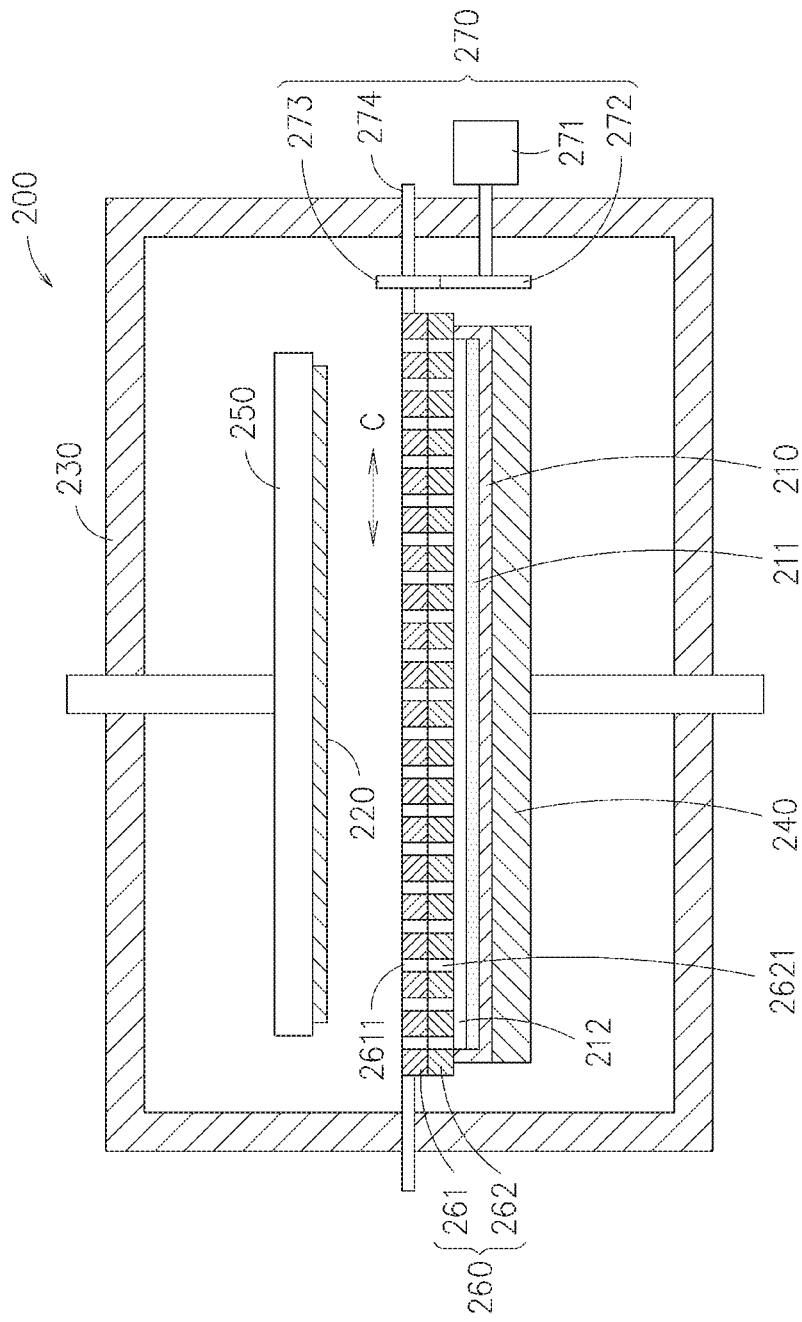
FIG. 3 is a schematic diagram showing the evaporation system of FIG. 2 where its shutter device is opened.

At the starting of the heated evaporation material 211 on the evaporation source plate 210 being evaporated, the upper panel 261 and the lower panel 262 remain at their respective initial positions without movement, i.e. the holes of the upper panel 261 and the lower panel 262 are not aligned with one another and thus are not in communication with one another, so that the space above the evaporation source plate 210 is an enclosed space, i.e. the enclosed heating area 212. As the evaporation source plate 210 is being heated by the heater 240, the evaporation material 211 is gradually being heated to its evaporating temperature and thus starts filling the confined enclosed heating area 212 with gaseous evaporation material 211. At the point when the pressure difference between the enclosed heating area 212 and the vacuum chamber 230 is over 1 to 2 orders of magnitude, the transmission device 270 is activated for enabling the either the upper panel 261 or the lower panel 262 to move in a flash in a manner that the holes of the upper panel 261 and the lower panel 262 are aligned with one another and thus are in communication with one another, and thus the gaseous evaporation material 211 can be allowed to flow into the evaporation chamber 230 where the pressure is lower for enabling a flash evaporation effect, as shown in FIG. 3. In addition, by the sizes, shapes and distribution of the holes 2611, 2621 on the upper panel 261 and lower panel 262 well designed, a uniform distributed vapor laminar flow can be achieved so as to form a uniform film deposition on the target substrate 220.

In the embodiment shown in FIG. 3, the transmission device 270 is composed of: a motor 271, a gear/pulley set 272, a ball nut 273, and a ball screw rod 274. As the upper panel 261 in FIG. 3 is fixedly coupled to the ball screw rod 274, the upper panel 261 can be brought along to move by a displacement C by the moving ball screw rod 274. The configuration of the transmission device 270 is about the same as the transmission device 170 shown in FIG. 1, but is different in that: the ball screw rod 274 is arranged extending from one side of the upper panel 261 to an opposite side thereof.

Figure 4:
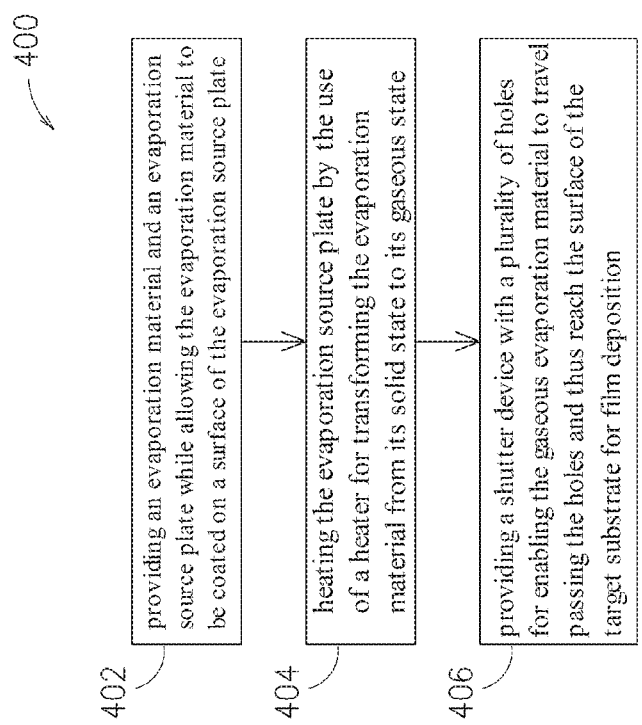
FIG. 4 is a flow chart depicting steps performed in an evaporation method of the present disclosure.

Please refer to FIG. 4, which is a flow chart depicting steps performed in an evaporation method of the present disclosure. The evaporation method 400 of FIG. 4 comprises the steps of:

Step 402: providing an evaporation material and an evaporation source plate while allowing the evaporation material to be coated on a surface of the evaporation source plate;

Step 404: heating the evaporation source plate by the use of a heater for transforming the evaporation material from its solid state to its gaseous state; and Step 406: providing a shutter device with a plurality of holes for enabling the gaseous evaporation material to travel passing the holes and thus reach the surface of the target substrate for film deposition, wherein the shutter device is coupled to a transmission device which is used for controlling the opening/closing of the holes.

The following description relating to the evaporation method of FIG. 4 is exemplified by the use of the evaporation system 100 of FIG. 1. In the step 402, first, the evaporation chamber 130 having the evaporation source plate 110 that is coated with an evaporation material 111 is provided, while the shutter device 160 is closed by the transmission device 170, i.e. the holes 1621 on the diffuser plate 162 is shielded by the shutter plate 161; and then the heater 140 is activated for heating the evaporation material 111 rapidly to its evaporating temperature. In this embodiment, the heater 140, which can be an infrared (IR) heater, a radio frequency (RF) heater, a microwave (MW) heater or a high-power heater, is being activated to perform a heating procedure at a rapid rate, likely 100° C./sec, for allowing the evaporation material 111 to reach its evaporating temperature quickly, likely within 5 seconds, as described in step 404. In step 404, as soon as the evaporation material 111 is heated by the heater 140 to its evaporating temperature, the evaporation material 111 is transformed from its solid state into its gaseous state for starting to fill the enclosed heating area 112, that is a space formed between the shutter device 160 and the evaporation source plate 110, with the vaporized evaporation material 111. At a time when the pressure difference between the enclosed heating area 112 and the vacuum chamber 130 is over 1 to 2 orders of magnitude, the transmission device 170 is activated for enabling the shutter plate 161 to open in a flash so as to expose the holes 1621 formed on the diffuser plate 162 for the gaseous evaporation material 111 to flow passing through and reach the surface of the target substrate 120 so as to form a uniform film deposition on the target substrate 120, as described in step 406.

The following description relating to the evaporation method of FIG. 4 is exemplified by the use of the evaporation system 200 of FIG. 2. In the step 402, first, the evaporation chamber 230 having the evaporation source plate 210 that is coated with an evaporation material 211 is provided, while the shutter device 260 is closed by the transmission device 270, i.e. the holes 2611, 2621 respectively on the upper panel 261 and the lower panel 262 are not aligned with one another; and then the heater 240 is activated for heating the evaporation material 211 rapidly to its evaporating temperature. In step 404, as soon as the evaporation material 211 is heated by the heater 240 to its evaporating temperature, the evaporation material 211 is transformed from its solid state into its gaseous state for starting to fill the enclosed heating area 212, that is a space formed between the shutter device 260 and the evaporation source plate 210, with the vaporized evaporation material 211. At a time when the pressure difference between the enclosed heating area 212 and the vacuum chamber 230 is over 1 to 2 orders of magnitude, the transmission device 270 is activated for enabling the shutter plate 260 to open by aligning the holes 2611 on the upper panel 261 with the holes 2621 on the lower panel 262 for allowing the gaseous evaporation material 211 to flow passing through the holes 2611, 2621 and reach the surface of the target substrate 220 so as to form a uniform film deposition on the target substrate 220, as described in step 406.

To sum up, by the rapid heating means that is operated cooperating with an instant-opened shutter device in the evaporation system and method of the present disclosure, the saturated vapor flow of the evaporation material with high pressure, i.e. the pressure difference between the enclosed heating area and the vacuum chamber is over 1 to 2 orders of magnitude, can be enabled to flow passing a shutter device in a flash, and thereby, a uniform distributed flash evaporation effect can be achieved. In another embodiment of the present disclosure, by the use of the shutter device that can be opened in a very brief period of time, holes formed respectively on two porous panels can be enabled to communicate with one another for allowing the saturated vapor flow of the evaporation material passing through and thus to be diffused with uniformly distributed flash evaporation effect. Moreover, by the sizes, shapes and distribution of the holes on the shutter device well designed, a uniform distributed vapor laminar flow can be achieved so as to form a uniform film deposition on the target substrate, and thereby, not only the unevenly film deposition caused by unstable vapor flow in the early stage of a conventional evaporation process is solved, but also the thermal crystal degradation of deposited film that is caused by the requiring of the evaporation chamber to be heated for a long period of time in conventional evaporation processes can be suppressed.

According to the above description, the present disclosure provides an evaporation method, which is substantially a large-area thin film deposition means with improved high deposition rate and material utilization ratio. By the rapid heating means that is operated cooperating with an instant shutter device in the present disclosure, the saturated vapor flow of the evaporation material with high pressure can be enabled to flow passing a diffuser plate in a flash, and thereby, an evenly distributed flash evaporation effect can be achieved.

In another embodiment of the present disclosure, by the use of the shutter device that can be opened in a very brief period of time, holes formed respectively on two porous panels can be enabled to communicate with one another for allowing the saturated vapor flow of the evaporation material to flow passing through and thus to be diffused with evenly distributed flash evaporation effect. By the use of the evaporation system and method of the present disclosure, not only the distance between the evaporation substrate and the evaporation source plate can be reduced, but also the material utilization ratio can be increased by 60%~70%.

Consequently, using the rapid heating means and the diffusion improving means that are disclosed in the present disclosure, an evenly distributed evaporation process can be achieved and also the problem of material waste and inefficient space utilization caused by large diffuse angle that are commonly seen in conventional point evaporation process can be solved. In addition, not only the unevenly film deposition caused by unstable vapor flow in the early stage of a conventional evaporation process is solved, but also the thermal crystal degradation that is caused by the requiring of the evaporation chamber to be heated for a long period of time in conventional evaporation processes can be suppressed.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. A vapor deposition method, comprising:
coating an evaporation material on a coated surface of an evaporation source plate;
sealing said coated surface inside said evaporation source plate with a shutter device comprising an upper panel with a first plurality of holes and a lower panel with a second plurality of holes;
heating the evaporation source plate to vaporize the evaporation material while said shutter device is closed; and
displacing the shutter device open in a side-to-side manner to release said vaporized evaporation material directly onto a target substrate when a first pressure inside the evaporation source plate exceeds two orders of magnitude above a second pressure outside of the evaporation source plate, said step of displacing the shutter device open comprising displacing said upper panel with respect to said lower panel to align said first plurality of holes with said second plurality of holes, whereby said vaporized evaporation material flows through said first plurality of holes and said second plurality of holes directly on to the target substrate.

2. The vapor deposition method of claim 1, wherein the heating step is performed with an infrared heater.

3. The vapor deposition method of claim 1, wherein the shutter device comprises a shutter plate and a diffuser plate formed with a plurality of holes, and the step of displacing the shutter device open comprises displacing said shutter plate off of the plurality of holes, whereby said vaporized evaporation material flows through the plurality of holes directly on to the target substrate.

4. The vapor deposition method of claim 1, wherein the heating step is performed with a radio frequency heater.

5. The vapor deposition method of claim 1, wherein the heating step is performed with a microwave heater.

6. The vapor deposition method of claim 1, wherein the step of displacing the shutter device open is performed with a motor turning a ball nut on a ball screw rod connected to said shutter device.

7. The vapor deposition method of claim 1, wherein said displacing the shutter device open step releases said vaporized evaporation material directly from said coated surface to said target substrate.

* * * * *